United States Patent [19]
Blacka

[11] Patent Number: 5,408,205
[45] Date of Patent: Apr. 18, 1995

[54] ULTRAHIGH ACCURACY DIGITAL PROGRAMMABLE ATTENUATOR

[75] Inventor: Robert J. Blacka, Pennsauken, N.J.

[73] Assignee: EMC Technology, Inc., Cherry Hill, N.J.

[21] Appl. No.: 143,460

[22] Filed: Oct. 26, 1993

[51] Int. Cl.$^6$ ............................................. H03H 7/24
[52] U.S. Cl. ................................. 333/81 R; 323/354
[58] Field of Search ........................... 333/81 R, 81 A; 323/354

[56] References Cited

U.S. PATENT DOCUMENTS 3,646,484  2/1972  Maxwell et al. .................. 333/81 R
3,713,037  1/1973  Hopfer ............................. 333/81 A

FOREIGN PATENT DOCUMENTS

91/18427  11/1991  WIPO ............................. 333/81 R

Primary Examiner—Paul Gensler
Attorney, Agent, or Firm—Norman E. Lehrer

[57] ABSTRACT

A high accuracy programmable attenuator for accurately selecting and maintaining desired values of attenuation for a high frequency RF signal. The attenuator is comprised of a plurality of cells wherein each cell is comprised of an individual attenuator, a switch and a bias resistor. Each bias resistor is comprised of a plurality of individual resistors arranged in a binary sequence and wire bonds are used to short out undesired resistors for compensating for insertion loss and obtaining desired attenuation. The attenuators of the circuit are also arranged in a binary sequence so as to allow the user to select from a large variety of attenuations in small increments.

13 Claims, 1 Drawing Sheet

ULTRAHIGH ACCURACY DIGITAL PROGRAMMABLE ATTENUATOR

BACKGROUND OF THE INVENTION

This invention relates to programmable attenuators, and more particularly, to a highly accurate programmable attenuator having particular advantages at high frequencies.

A programmable attenuator is a device which allows for the attenuation of a microwave or RF signal to be adjusted to a predetermined value within a particular setup. The accuracy of programmable attenuators is dependant upon how closely the actual attenuation is to the expected or selected value at a particular frequency or over a given frequency range. The accuracy of a programmable attenuator is measured by stating the number of decibels (dB) that the measured value deviates from the selected value. This deviation may, of course, vary from one frequency to another frequency. A programmable attenuator with a deviation greater than 0.5 dB is generally considered to have low accuracy, whereas deviations between 0.2 and 0.5 dB are considered to have medium accuracy and deviations of less than 0.2 dB are considered high accuracy. An ideal programmable attenuator would have a deviation of less than 0.1 dB but such attenuators have been generally impractical with current technology. However, this invention discloses a method for mass producing programmable attenuators with a deviation of 0.1 dB or less.

In general, a digital programmable attenuator is a device consisting of one or more attenuators connected to an equal number of switches. The switches (which may be either mechanical or electrically controlled) are wired in the circuit with the attenuators so that the microwave or RF signal is forced to travel either through an attenuator or directly across the switch, imparting little or no attenuation to the signal. The common way of configuring a programmable attenuator is by using six attenuators positioned in a binary sequence, so that each successive attenuator is twice the decibel value of the previous one. The binary sequence arrangement allows for the selection of multiple values of attenuation through the combination of particular attenuators chosen from the sequence. The accuracy of the entire programmable attenuator is largely dependent upon the accuracy of the individual attenuators making up the circuit. Accuracy is determined by adding the accuracy of each attenuator and obtaining a final figure. Accordingly, if each attenuator has an error of approximately 0.1 dB and there are six individual attenuators in the circuit, the total error for the circuit equals 0.6 dB.

Currently, it is the practice in trying to obtain high accuracy attenuators to select individual attenuators having margins of error above and below nominal so that the errors cancel out. Unfortunately, this is a time consuming, and therefore expensive task. In addition, the switches which also make up the attenuator circuit provide an inherent loss thereto. That is, each switch of a circuit may vary as to accuracy up to as much as 0.2 dB per switch. Therefore, even if highly accurate individual attenuators are obtained, the switches themselves making up the circuit taint the accuracy of the entire programmable attenuator. Unfortunately, there is no way of determining the loss through the switches until they are arranged in the circuit.

Because of the inherent losses in the switch, in designing the programmable attenuator, attenuation is always referenced to the zero decibel or "insertion loss" state. In this state, all of the individual attenuators are switched out of the circuit and the signal travels directly through the switches without any interruption. However, as mentioned, all switches used in programmable attenuators inherently have some loss which affects the signal traveling therethrough. The measure of this loss is commonly referred to as the insertion loss and attenuation is equal to the combined attenuator values minus the insertion loss. Designers strive to make the insertion loss as small as possible. However, it can be quite significant and somewhat unpredictable. Therefore, the attenuation of the circuit must be referenced to the loss associated with the switches. To acquire the desired attenuation, this loss must be accounted for by increasing the attenuation of the individual attenuators.

The conventional way of dealing with the variation and loss of the switches used for the circuit is to use manufacturing history to guess at the value of each attenuator and its switch. After guessing, the attenuators are fixed to the circuit and a final value for the programmable attenuator is determined. If this value is still greater than the desired attenuation, attenuators and switches are removed and replaced in the circuit until the desired value is obtained. This process, while marginally effective, is extremely time consuming and it is often impossible to find attenuators having the attenuation value that is required for precisely designing the circuit.

The prior art discloses several patents directed to compensating for impedance error within an attenuator circuit. U.S. Pat. No. 4,138,637 to Weinhart, for example, discloses a step attenuator including means for compensating for impedance errors in a circuit. While Weinhart does disclose the use of a shunt resistor, it is a fixed value which simply adds to the problems discussed above.

U.S. Pat. No. 4,952,893 to Cuddy discloses an attenuating circuit having an attenuation signal path and a reference path wherein the reference path is adapted to be attenuated by an amount related to the attenuation path for the purpose of improving accuracy. However, the adjustments and compensation to the circuit for desired attenuation are performed on the attenuation path and not the reference path seemingly as described above and unlike the instant invention.

The invention described herein however, discloses a method and apparatus for producing an ultrahigh accuracy programmable attenuator without having to repeatedly remove and replace components of the circuit. Therefore, considerable time and effort is saved which is also reflected in the cost of the device.

SUMMARY OF THE INVENTION

This invention is directed toward a programmable attenuator which uses the principle of net attenuation and has easily accessible means for adjusting the attenuation of the circuit for forming an attenuator which is highly accurate at all frequencies.

The high accuracy programmable attenuator is comprised of an input and output port, a series of attenuators and a series of gallium arsenide field effect transistor (GaAs FET) switches which are arranged so that a signal must flow either through one or more fixed attenuators or through the direct connection between the switches. Therefore, the programmable attenuator herein comprises an attenuation path and a zero reference path. The zero reference path occurs when all of the circuit attenuators are switched out of the circuit. The invention lies in recognizing and compensating for the fact that the GaAs FET switches are not perfect switches and therefore exhibit some internal resistance which leads to attenuation loss.

For this invention, the GaAs FET switches are connected at one set of terminals to a third resistance path which is part of the zero reference path, the first and second resistance paths being representative of the internal resistances within the switch. The addition of the third resistance path causes the switch, when the attenuators are switched out of the circuit, to act as a conventional T-type attenuator with the third resistor forming the shunt arm of the attenuator. The resistor is used to provide a method for trimming the net attenuation of each switch and attenuator bit to the exact value desired.

The third resistor path is preferably comprised of a tapped resistor instead of a fixed resistor. The tapped resistor includes a plurality of individual resistors arranged in a binary sequence so that many different values can be selected by shorting out or by passing various resistors of the resistance path. By connecting wire bonds among the plurality of resistors comprising the third resistance path, the attenuation of the zero reference path or thru path can be varied by varying the resistance of the tapped resistor. Relatively large variations in the third resistance path can be made to cause very small variations in attenuation because it is a shunt resistor of the T-type attenuator formed. Therefore, an accuracy multiplication circuit is formed wherein one resistor with low accuracy is able to calibrate a circuit to a very high accuracy.

The programmable attenuator is used by first switching the switch to the thru path for each bit. As discussed, the bias resistors are then used to calibrate the through path to a zero insertion loss reference point. The wire bonds can be used to short certain individual resistors from the attenuator formed in the through path so as to acquire the necessary value for offsetting the insertion loss represented by the internal switch resistances. This is done for each bit of the circuit. The individual attenuators are then switched in depending upon the amount of attenuation desired. A binary sequence is used as a mode for selecting the desired attenuation by including certain attenuators of the series of attenuators in the circuit or removing the same. As a result, a high accuracy programmable attenuator is obtained which allows the user to select and maintain the desired attenuation to very high accuracy.

BRIEF DESCRIPTION OF THE DRAWING

For the purpose of illustrating the invention, there is shown in the accompanying drawings one form which is presently preferred; it being understood that the invention is not intended to be limited to the precise arrangements and instrumentalities shown.

DETAILED DESCRIPTION OF THE PREFERRED EMBODIMENT

Figure 1:
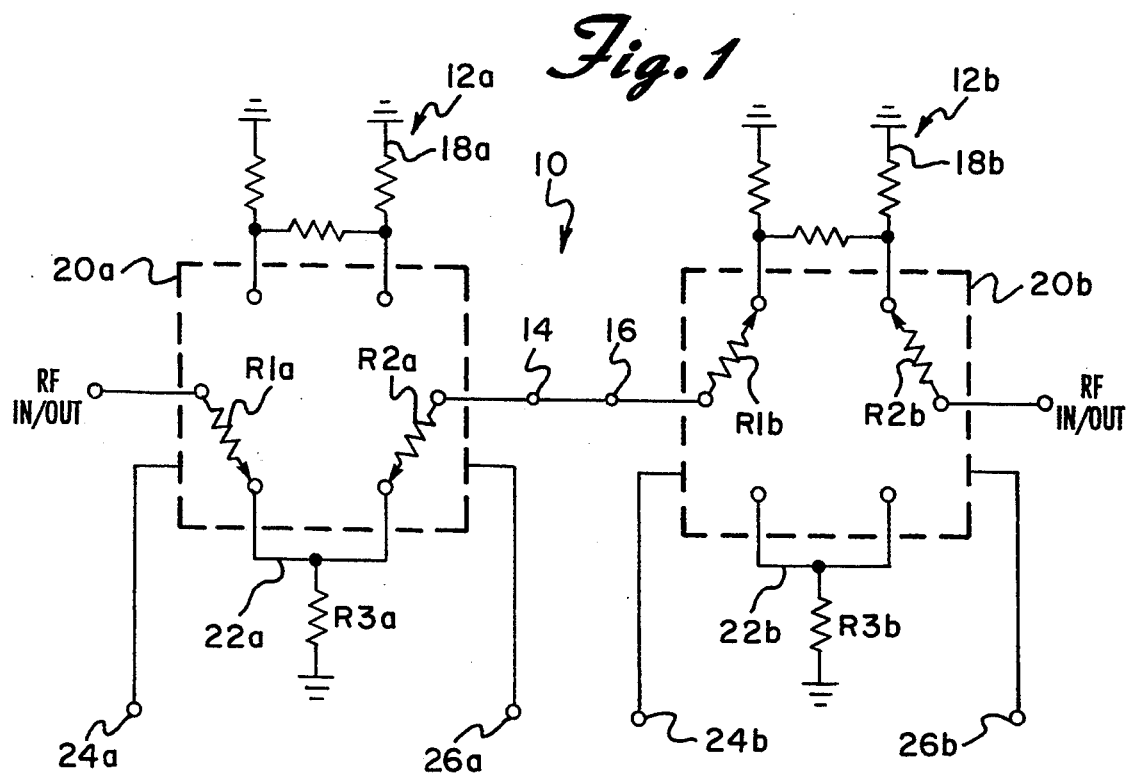
FIG. 1 is an schematic of a programmable attenuator circuit showing the attenuation path and the zero reference path.

Referring now to the drawings in detail wherein like reference numerals have been used in the figures to designate like elements, there is shown in FIG. 1 a diagram of a programmable attenuator circuit designated generally as 10. The circuit 10 is comprised essentially of a plurality of series connected attenuator bits or cells such as shown on 12a and 12b; the output 14 of cell 12a being connected to the input 16 of cell 12b.

Each cell 12a and 12b includes a fixed attenuator such as shown at 18a and 18b, a gallium arsenide (GaAs) field effect transistor (FET) switch such as shown at 20a and 20b and a bias resistor such as shown at R3a and R3b.

Each switch such as 20a or 20b is arranged so that the RF or microwave signal flowing through the attenuator cell flows either through the fixed attenuator 18a or 18b or through the direct connection such as shown at 22a and 22b. Switch 20a, for example, shows the switch in the position wherein the signal flows through the direct connection 22a whereas switch 20b shows the same in the position wherein the signal flows through the fixed attenuator 18b. The path that the signal takes i.e. the position of the switch depends on the voltage at the control ports 24a, 26a, 24b or 26b which is controlled by the user in the known manner.

While only two attenuator cells 12a and 12b are shown in FIG. 1, it will be understood that any number of such cells may be utilized. In the preferred embodiment, six such cells are utilized and these are arranged in a binary sequence. That is, each successive attenuator 12a, 12b etc. is twice the value of the previous one. Thus, for example, fixed attenuator 12a may have a value of 0.5 dB, fixed attenuator 12b would have a value of 1 dB, the next attenuator would have a value of 2 dB, and next 4 dB etc. This particular sequence allows any value of attenuation between 0.5 dB and 31.5 dB in 0.5 dB steps depending on the various combinations of the fixed attenuators which, of course, are determined by the positions of the various GaAS switches.

The foregoing arrangement is generally known in the art. What is further known is the fact that the GaAs FET switches are not perfect switches and they, therefore, display some internal resistance which is the source of the loss described above. Resistances R1a and R2a shown within switch 20a and R1b and R2b shown within the switch 20b represent these internal resistances which can measure between 2 and 3 ohms. As is also known in the art, the function of the bias resistors R3a and R3b is to ensure that the ports connected to the "thru path" have the correct voltage on them at all times.

As will be apparent to those skilled in the art, when the GaAs FET switch is switched to the "thru path" such as illustrated in switch 20a, the combination of R1a, R2a and R3a form a conventional "T" type attenuator with R3a forming the shunt arm of the attenuator. For this reason, the value of this resistor in conventional variable attenuator circuits is normally made as high as possible to minimize losses while maintaining the electrical requirements of the circuit. In such prior circuits, however, the value of R3a or R3b has been fixed. The present invention utilizes this portion of the attenuator circuit to provide a method to trim the net attenuation of each cell to the exact value desired.

Figure 2:
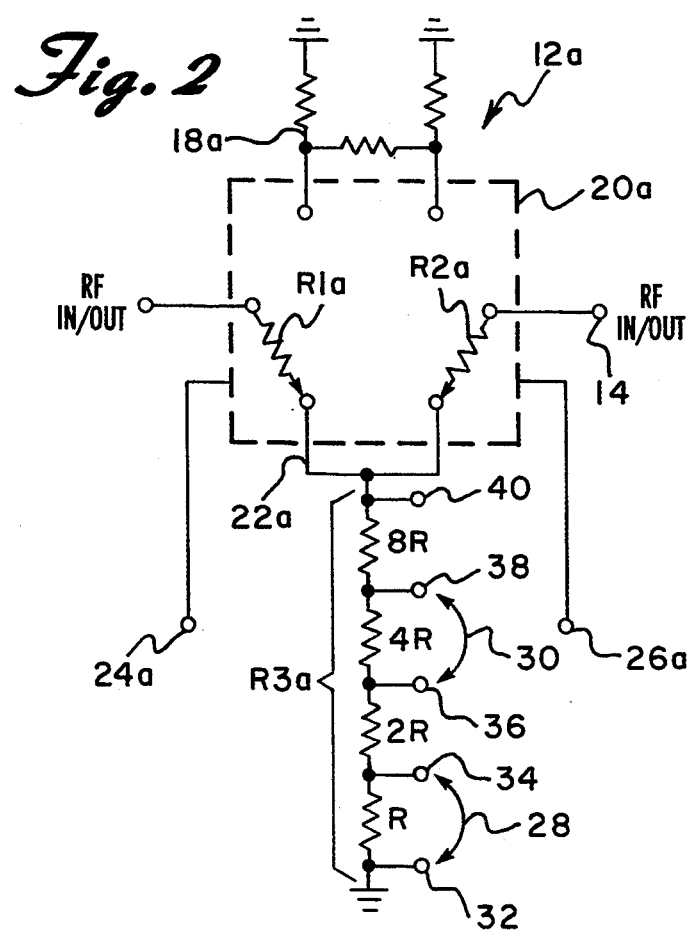
FIG. 2 is a representation of a single cell or bit of the programmable attenuator described herein.

FIG. 2 illustrates in more detail the improved attenuator circuit of the present invention. Shown in this figure is a single attenuator cell 12a which will now be described. It will be understood, however, that each of the attenuator cells of the, for example, six cells utilized in the conventional programmable attenuator circuit will be constructed in substantially the same manner.

As shown in FIG. 2, the fixed bias or shunt resistor R3a of FIG. 1 has been replaced by a tapped resistor R3a. Tapped resistor R3a of FIG. 2 is comprised of a plurality of individual resistors, the values of which are preferably arranged in a binary sequence so that many different values can be selected by shorting out various sections. That is, the lower most section of resistor R3a may have a value of R, the second section a value of 2R, the third a value of 4R and the forth, a value of 8R. This is, of course, by way of example only and other values and numbers of individual resistors can be utilized. Wire bonds or shunts such as shown at 28 and 30 can be connected to the terminals 32, 34, 36, 38 or 40 between to the ends of each individual resistors to short out selected ones thereof.

Since the combination of resistors R1a, R2a and R3a form a "T" type attenuator, one can adjust the attenuation of the "thru path" by varying only one resistor i.e. R3a. A significant value of this method is that relatively large variations in R3a (i.e 50 ohms) cause vary small variations in the attenuation (i.e. 0.01 dB). Therefore, the arrangement forms an "accuracy multiplication" circuit wherein one resistor with low accuracy is able to calibrate a circuit to very high accuracy.

As may be apparent to those skilled in the art, there are a number of very significant inherent advantages to adjusting the attenuation accuracy with the use of the present invention as opposed to more conventional methods. First, the frequency response of the attenuated state is unaffected which is not the case when the resistors on the fixed attenuator are varied. Second, thermal variations in the value of the adjusting resistor R3a have practically no effect on the circuit attenuation accuracy. Third, the inventive method lends itself conveniently to hybrid type construction where unpackaged parts, commonly refereed to as "die", are used to save space. Fourth, the circuit can be calibrated by only adding or removing wire bonds, which, per se, is a well known and widely used process. Fifth, the calibration is stable over temperature and time and is permanent once the unit is sealed. And sixth, the invention does not add any parts to the circuit but merely substitutes one part for another. Therefore, there is a minimal effect on cost and time.

The present invention may be embodied in other specific forms without departing from the spirit or essential attributes thereof and accordingly reference should be made to the appended claims rather than to the foregoing specification as indicating the scope of the invention.

What is claimed is:

1. In a programmable attenuator circuit comprising a plurality of attenuation circuits, each attenuation circuit having an attenuation signal path and a reference signal path and an electrically controlled switch for switching between said attenuation signal path and said reference signal path, each switch including a bias resistance means connected thereto; the improvement comprising means for varying the value of said bias resistance means.

2. The invention as claimed in claim 1 wherein said bias resistance means is comprised of a plurality of resistors and wherein said means for varying includes means for selecting different combinations of said resistors.

3. The invention as claimed in claim 2 wherein said resistors are connected in series.

4. The invention as claimed in claim 3 wherein the values of said resistors in the series increase in a binary sequence.

5. The invention as claimed in claim 2 wherein the means for selecting includes means for shorting out one or more of said resistors.

6. The invention as claimed in claim 1 wherein each of said switches is a gallium arsenide switch.

7. The invention as claimed in claim 1 wherein each of said switches includes inherent resistance therein and wherein said bias resistance means combines with said inherent resistance to form an attenuation network.

8. The invention as claimed in claim 7 wherein said bias resistance means is comprised of a plurality of resistors and wherein said means for varying includes means for selecting different combinations of said resistors.

9. The invention as claimed in claim 8 wherein said resistors are connected in series.

10. The invention as claimed in claim 9 wherein the values of said resistors in the series increase in a binary sequence.

11. The invention as claimed in claim 8 wherein the means for selecting includes means for shorting out one or more of said resistors.

12. The invention as claimed in claim 7 wherein each of said switches is a gallium arsenide switch.

13. The invention as claimed in claim 7 wherein each said attenuation network forms a T-type attenuator with said bias resistance means forming the shunt element thereof.

* * * * *